(12) United States Patent
Jimenez

(10) Patent No.: US 10,361,188 B2
(45) Date of Patent: Jul. 23, 2019

(54) METHOD FOR FABRICATING A JFET TRANSISTOR WITHIN AN INTEGRATED CIRCUIT AND CORRESPONDING INTEGRATED CIRCUIT

(71) Applicant: STMicroelectronics (Crolles 2) SAS, Crolles (FR)

(72) Inventor: Jean Jimenez, Salles d'Aude (FR)

(73) Assignee: STMicroelectronics (Crolles 2) SAS, Crolles (FR)

( * ) Notice: Subject to any disclaimer, the term of this patent is extended or adjusted under 35 U.S.C. 154(b) by 257 days.

(21) Appl. No.: 15/133,595

(22) Filed: Apr. 20, 2016

(65) Prior Publication Data

US 2017/0179113 A1 Jun. 22, 2017

(30) Foreign Application Priority Data

Dec. 21, 2015 (FR) ..................................... 15 62956

(51) Int. Cl.
| | |
|---|---|
| H01L 27/06 | (2006.01) |
| H01L 29/66 | (2006.01) |
| H01L 27/082 | (2006.01) |
| H01L 27/092 | (2006.01) |
| H01L 29/732 | (2006.01) |
| H01L 29/808 | (2006.01) |
| H01L 21/8228 | (2006.01) |
| H01L 21/8238 | (2006.01) |
| H01L 21/8249 | (2006.01) |

(52) U.S. Cl.
CPC ...... *H01L 27/0623* (2013.01); *H01L 21/8249* (2013.01); *H01L 21/82285* (2013.01); *H01L 21/823885* (2013.01); *H01L 27/0826* (2013.01); *H01L 27/092* (2013.01); *H01L 29/66909* (2013.01); *H01L 29/732* (2013.01); *H01L 29/8083* (2013.01)

(58) Field of Classification Search
CPC ......... H01L 21/8249; H01L 21/823885; H01L 21/82285; H01L 27/0623; H01L 27/092; H01L 27/0826; H01L 29/8083; H01L 29/66909; H01L 29/732
USPC ...................................................... 257/262
See application file for complete search history.

(56) References Cited

U.S. PATENT DOCUMENTS

| | | | |
|---|---|---|---|
| 4,205,334 A | 5/1980 | Nonaka et al. | |
| 4,234,803 A | 11/1980 | Nonaka | |
| 4,325,180 A * | 4/1982 | Curran | G05F 3/20 257/262 |
| 4,403,395 A * | 9/1983 | Curran | G05F 3/20 257/E21.544 |

(Continued)

FOREIGN PATENT DOCUMENTS

DE 3916707 A1 1/1990

OTHER PUBLICATIONS

INPI Search Report and Written Opinion for FR 1562956 dated Jul. 13, 2016 (10 pages).

*Primary Examiner* — Mohsen Ahmadi
*Assistant Examiner* — Scott E Bauman
(74) *Attorney, Agent, or Firm* — Crowe & Dunlevy

(57) ABSTRACT

An integrated circuit of the BiCMOS type includes at least one vertical junction field-effect transistor. The vertical junction field-effect transistor is formed to include a channel region having a critical dimension of active surface that is controlled by photolithography.

9 Claims, 5 Drawing Sheets

(56) References Cited

U.S. PATENT DOCUMENTS

| | | | | |
|---|---|---|---|---|
| 4,546,370 | A * | 10/1985 | Curran | G05F 3/20 |
| | | | | 257/370 |
| 4,816,880 | A * | 3/1989 | Muro | H01L 29/42316 |
| | | | | 257/272 |
| 2004/0222475 | A1* | 11/2004 | Hao | H01L 21/8232 |
| | | | | 257/376 |
| 2005/0067631 | A1* | 3/2005 | Pendharker | H01L 29/808 |
| | | | | 257/134 |
| 2005/0258454 | A1* | 11/2005 | Kumar | H01L 27/098 |
| | | | | 257/211 |
| 2007/0069250 | A1* | 3/2007 | Chen | H01L 21/823892 |
| | | | | 257/256 |
| 2008/0153216 | A1* | 6/2008 | Kumar | H01L 27/098 |
| | | | | 438/173 |
| 2013/0313568 | A1* | 11/2013 | Hayashi | H01L 21/28008 |
| | | | | 257/77 |
| 2014/0001518 | A1* | 1/2014 | Huang | H01L 27/0623 |
| | | | | 257/270 |
| 2014/0117416 | A1* | 5/2014 | Zhang | H01L 21/8232 |
| | | | | 257/262 |
| 2016/0049403 | A1* | 2/2016 | Asa | H01L 21/26513 |
| | | | | 257/369 |

* cited by examiner

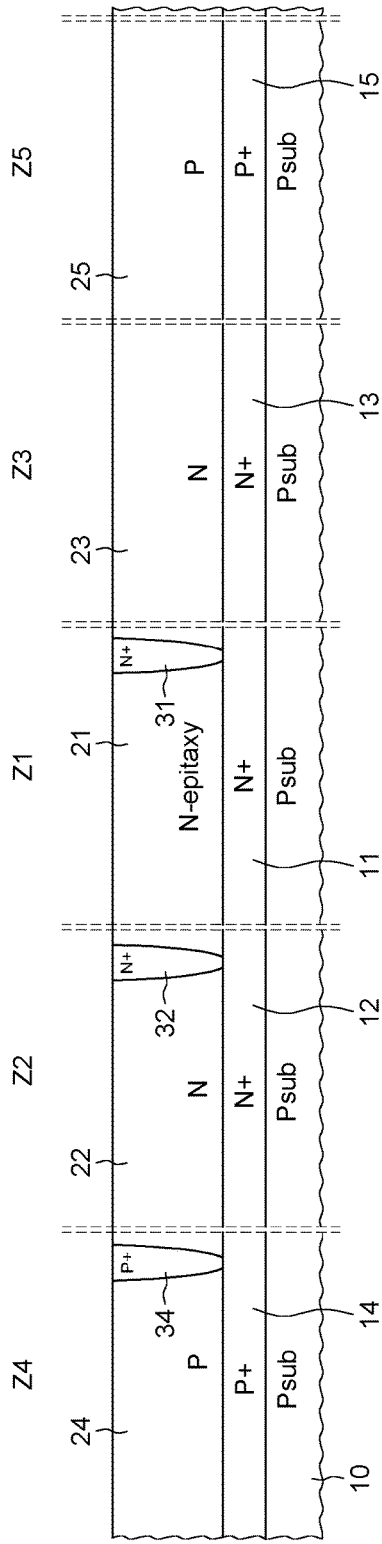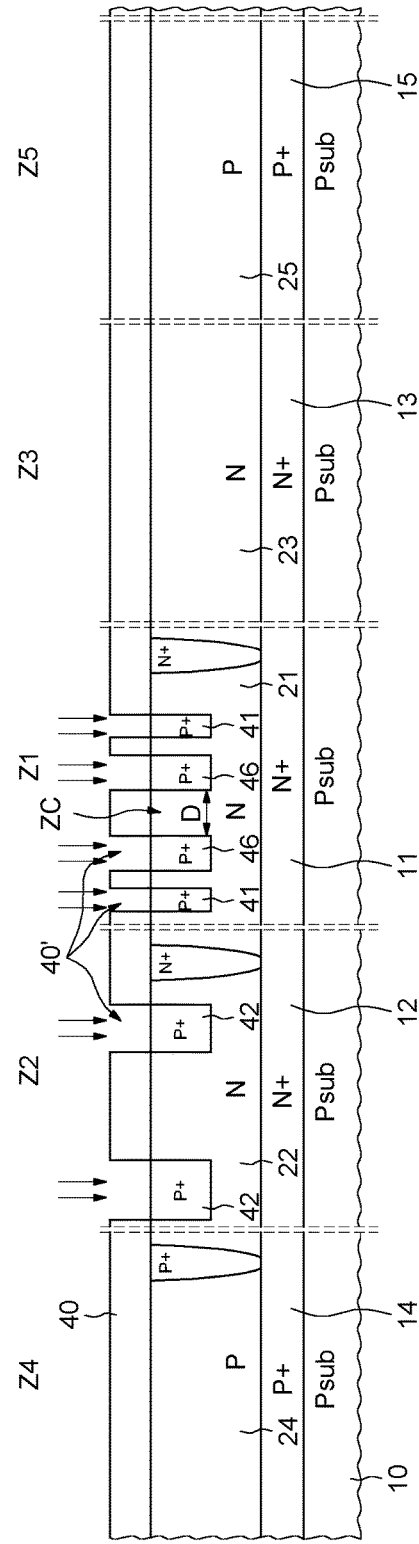

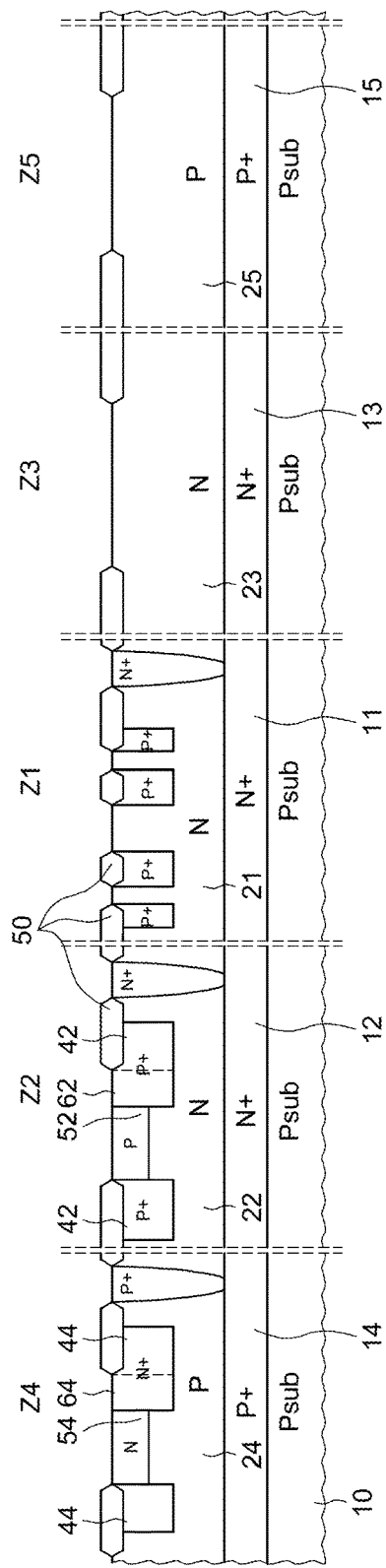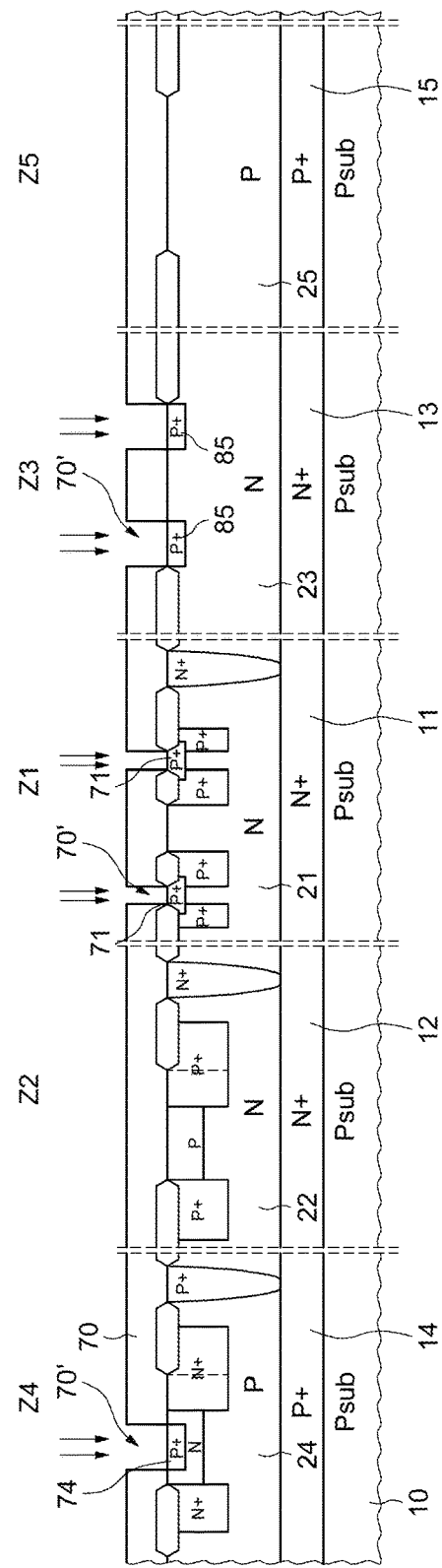

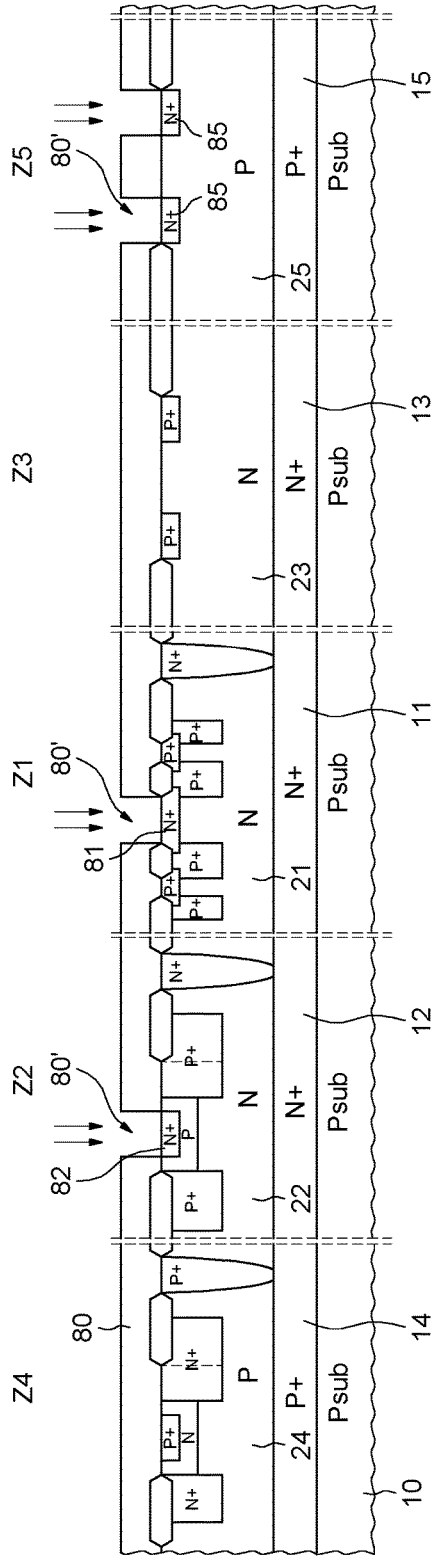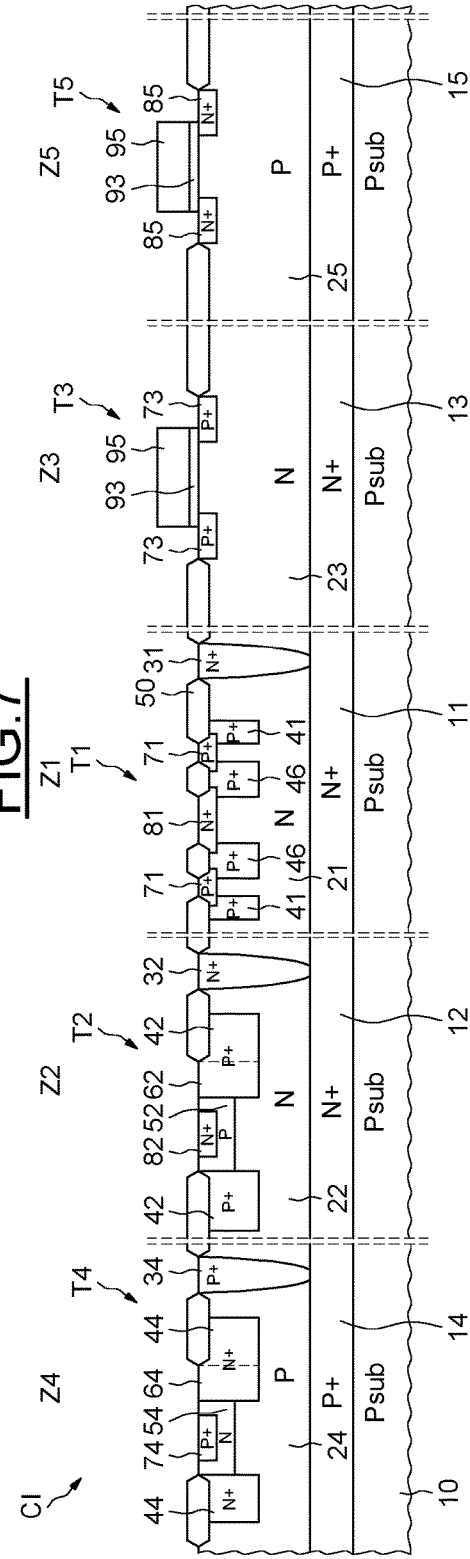

METHOD FOR FABRICATING A JFET TRANSISTOR WITHIN AN INTEGRATED CIRCUIT AND CORRESPONDING INTEGRATED CIRCUIT

PRIORITY CLAIM

This application claims priority from French Application for Patent No. 1562956 filed Dec. 21, 2015, the disclosure of which is incorporated by reference.

TECHNICAL FIELD

Various embodiments of the invention and their implementation relate to integrated circuits, in particular the fabrication of junction field-effect transistors (JFET) within a semiconductor substrate adapted to bipolar technologies and CMOS technologies (BiCMOS).

BACKGROUND

JFET transistors generally offer a low electrical noise at the output, and generally have a good high voltage performance. For example, JFET transistors are found in the input stages of precision operational amplifiers with a high input impedance.

Bipolar transistors exhibit a high gain, a high output impedance, and offer good performance at high frequencies, which allows them to be advantageously used for example in high-frequency analog amplifiers.

On the other hand, MOS transistors, fabricated using a CMOS technology, generally exhibit a high input impedance and are notably used in logic circuits for digital electronics.

BiCMOS technology offers the advantages of the two types of technologies (bipolar and CMOS), and is advantageously used for applications with mixed signals (analog and digital).

However, the methods for fabricating electronic circuits of the BiCMOS type must satisfy the production constraints of both bipolar and CMOS technologies, notably owing to the different individual steps between the two technologies.

Currently, the integration of JFET transistors into a BiCMOS integrated circuit involves the introduction of additional steps into fabrication methods already subject to significant constraints, leading to drawbacks of cost.

Furthermore, the current JFET transistors are planar, having lateral junctions.

The pinch voltage of a JFET transistor is directly dependent on the geometry of the junction, and is notably determined by the critical dimension of the active surface of the channel.

The channel region of a planar JFET transistor is commonly formed by interleaved layers of doped semiconductor materials, forming an arrangement of the source, gate and drain regions of the JFET transistor.

Thus, the size of the channel of a planar JFET transistor, notably its critical dimension of active surface, is determined by diffusions of dopants and is consequently difficult to control and adjust.

Furthermore, within the same process for production of planar JFET transistors, forming JFET transistors having pinch voltages that are different from one another requires additional masking and implantation steps.

SUMMARY

According to one embodiment, a JFET transistor is provided having a channel region whose channel critical dimension is better controlled according to one embodiment and its implementation.

According to one embodiment, a method is also provided for fabricating a JFET transistor within an integrated circuit of the BiCMOS type which does not include any step that is additional to a conventional method for fabricating integrated circuits of the BiCMOS type.

According to one aspect, a method is provided for fabricating an integrated circuit comprising the fabrication of at least one vertical junction field-effect transistor comprising the formation of a channel region having a critical dimension of active surface controlled by photolithography.

This method may comprise several simultaneous processes for fabrication of vertical junction field-effect transistors in which various critical dimensions of active surface of the channel region from one transistor to another are controlled during a common photolithography step.

Since the conventional and known photolithography processes are well controlled, precise and reproducible, the critical dimension of active surface of the channel region exhibits a very low variability from one implementation of the method to another. The pinch voltages of the transistors fabricated by this method therefore also exhibit a very low variability.

Furthermore, photolithographic processes are common steps in the methods for fabricating electronic circuits and are easily modifiable. Thus, according to this aspect, it is possible to fabricate several JFET transistors whose pinch voltages are different during the implementation of the same method, without any additional process step or time.

Furthermore, the vertical nature of the JFET transistor allows it to be easily inserted into a fabrication process of the CMOS type.

According to one embodiment of the method, the formation of the channel region comprises the formation, in a semiconductor well of a first type of conductivity, of two gate regions of a second type of conductivity, the critical dimensions of active surface of the channel region being defined by the spacing between the two gate regions.

The fabrication of the vertical junction field-effect transistor may further comprise the formation of gate contact regions of the second type of conductivity in contact with the two gate regions.

The fabrication of the vertical junction field-effect transistor may further comprise the formation of a drain region comprising the formation under the well of a buried layer of the first type of conductivity, more highly doped than the well, and the formation of a contact well of the first type of conductivity and extending from the surface of the semiconductor well down to the buried layer.

The fabrication of the vertical junction field-effect transistor may further comprise the formation of a source region of the first type of conductivity in contact with the channel region.

One implementation of the method according to this aspect is also provided, which does not include any step additional to a conventional method for fabricating integrated circuits of the BiCMOS type.

According to this embodiment, the method further comprises formation, in respective wells of the appropriate type of conductivity, of at least one bipolar transistor of a first type of conductivity, of at least one bipolar transistor of a second type of conductivity, of at least one insulated-gate field-effect transistor of a first type of conductivity and of at least one insulated-gate field-effect transistor of a second type of conductivity, formed simultaneously with the fabrication of the at least one vertical junction field-effect transistor.

Each step of the method for fabricating the vertical JFET transistor may be advantageously carried out simultaneously with a conventional step for fabricating a bipolar transistor of the N type (NPN) or of the P type (PNP) and/or with a conventional step for fabricating an insulated-gate field-effect transistor of the N type (NMOS) or of the P type (PMOS).

The method may comprise the formation of field implantation regions of the second type of conductivity within the wells of the bipolar transistors of the first type of conductivity, simultaneously with the formation the gate regions.

Indeed, integrated circuits of the BiCMOS type, for example present on an input stage of a high-voltage operational amplifier, must occasionally withstand voltages of the order of 40 volts. Implementing field implantations formed by trenches filled with a highly-doped material allows the field lines to be spread out further away from the active junctions and thus the voltage capability of the components of the integrated circuit to be improved.

The method may comprise the formation of emitter regions of bipolar transistors of the second type of conductivity and/or of source/drain regions of insulated-gate field-effect transistors of the second type of conductivity, simultaneously with the formation of the gate contact regions of the JFET transistor.

The method may comprise the formation of a collector region of a bipolar transistor of the first type of conductivity comprising the formation of a buried layer of the first type of conductivity, more highly doped than the semiconductor well of the bipolar transistor, and the formation of a contact well of the first type of conductivity extending from the surface of the well of the bipolar transistor down to the buried layer, simultaneously with the formation of the drain region of the vertical junction field-effect transistor.

The method may comprise the formation of emitter regions of bipolar transistors of the first type of conductivity and/or of source/drain regions of insulated-gate field-effect transistors of the first type of conductivity, simultaneously with the formation of the source region of the vertical junction field-effect transistor.

The formation of emitter regions of a first or second type of conductivity, of source and drain regions of a first or of a second type of conductivity, and of collector regions of a first type of conductivity comprising a contact well and a buried layer, are conventional steps of the methods for fabricating integrated circuits of the BiCMOS type.

The fabrication of the JFET transistor does not introduce in this respect any additional step with respect to a conventional method.

According to another aspect, an integrated circuit is provided comprising at least one vertical junction field-effect transistor, comprising a semiconductor well of a first type of conductivity, a drain region comprising a buried layer of the first type of conductivity, more highly doped than the well, and a contact well of the first type of conductivity extending from the surface of the well down to the buried layer, a gate region comprising two trenches filled with a semiconductor material of a second type of conductivity bounding a channel region, and a source region of the first type of conductivity on top of the channel region.

The integrated circuit may further comprise at least one bipolar transistor of a first type of conductivity and at least one bipolar transistor of a second type of conductivity, at least one insulated-gate field-effect transistor of a first type of conductivity and at least one insulated-gate field-effect transistor of a second type of conductivity.

The buried layer and the drain contact well of the junction field-effect transistor can be at the same levels as buried layers and contact wells of the collector regions of the bipolar transistors.

The gate region of the junction field-effect transistor can be at the same level as field implantation regions of bipolar transistors of the first type of conductivity.

The source region of the junction field-effect transistor can be at the same level as emitter regions of bipolar transistors of the first type of conductivity and/or at the same level as drain/source regions of insulated-gate field-effect transistors of the first type of conductivity.

The junction field-effect transistor may comprise gate contact regions of the second type of conductivity in contact with the gate regions, and which can be situated at the same level as emitter regions of bipolar transistors of the second type.

According to one embodiment, the integrated circuit comprises a plurality of vertical junction field-effect transistors, the various junction field-effect transistors having channel regions with critical dimensions of active surface different from one transistor to another.

The integrated circuit may comprise a plurality of junction field-effect transistors forming a cellular structure.

Using cellular structure architectures avoids constraining and unpredictable edge effects appearing in extended JFET transistors.

BRIEF DESCRIPTION OF THE DRAWINGS

Other advantages and features of the invention will become apparent upon examining the detailed description of non-limiting embodiments and their implementation and from the appended drawings in which:

FIGS. 1 to 8 show embodiments of the invention and their implementation.

DETAILED DESCRIPTION

For the sake of clarity, as is common in the representation of integrated circuits, FIGS. 1 to 8 are shown schematically and are not to scale, the common elements from one figure to another being denoted using the same references.

Furthermore, in the following, the first type of conductivity will be denoted as being the N type and the second type of conductivity as being the P type, even though the reverse is also possible according to the invention.

Figure 1:
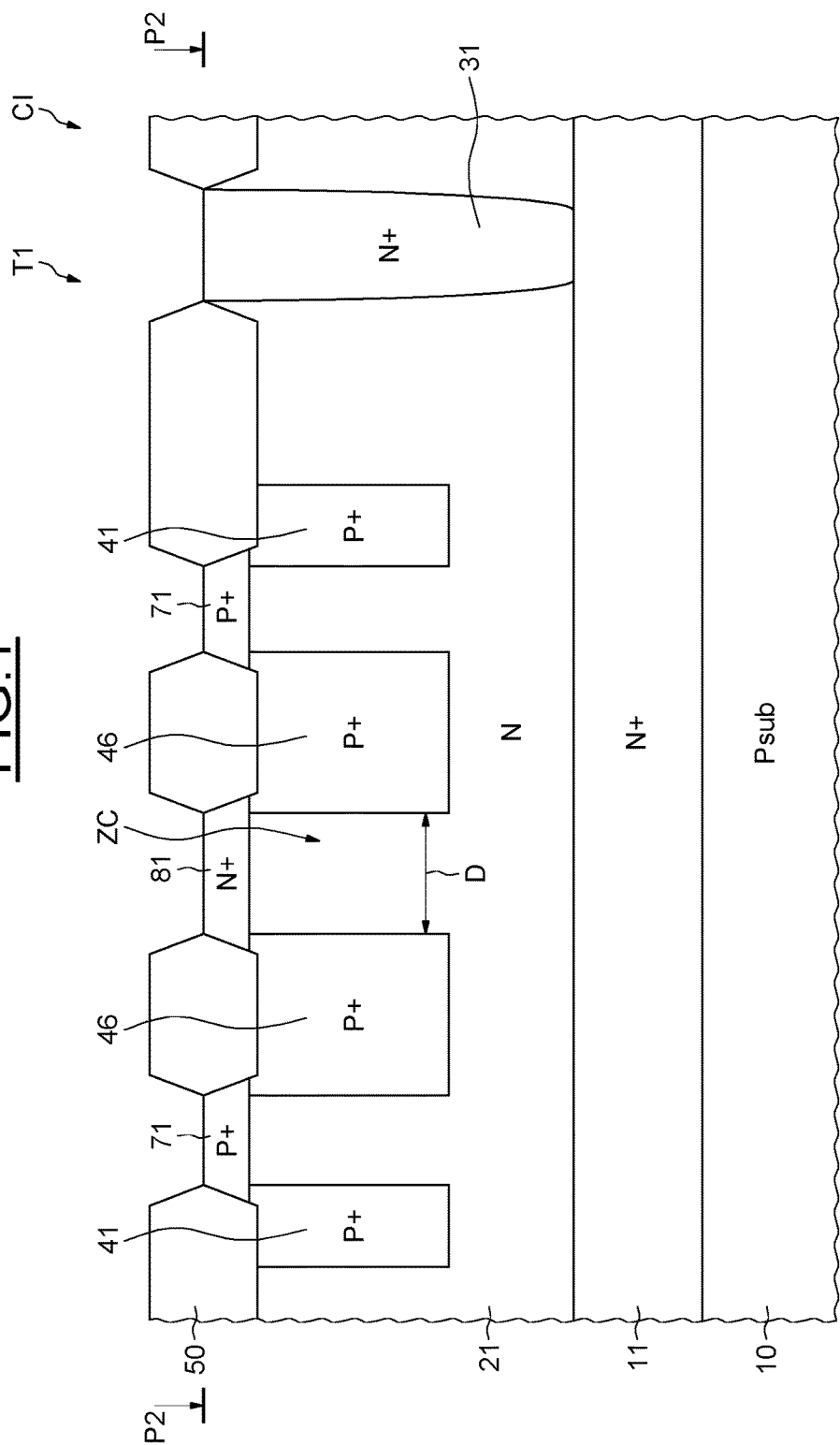

FIG. 1 illustrates one example of a vertical junction field-effect transistor T1, forming part of an integrated circuit CI formed on a semiconductor substrate 10 with P-type doping. This transistor T1 is notably fabricated within a semiconductor well 21 with N-type doping and comprises a drain region, a source region 81, a gate region 46, and a channel region ZC.

The drain region comprises a buried layer 11 of the $N^+$ type, more highly doped than the well 21, and a contact well 31 also highly-doped of the $N^+$ type. The contact well 31 extends from the surface of the well 21 down to the buried layer 11.

The gate region 46 comprises two neighboring vertical trenches filled with a highly-doped semiconductor material of the $P^+$ type. These trenches bound the vertical channel region ZC between them. The distance D between these trenches defines the critical dimension of active surface of the channel of the transistor.

Highly-doped gate contact regions 71 of the P type are disposed on the surface of the well 21 and in contact with the gate regions 46.

The highly-doped source region 81 of the N$^+$ type is formed on top of the channel region ZC, also on the surface of the well 21.

Furthermore, local regions of oxidation 50 are formed between the gate contact regions 71 and the source region 81 and between the gate contact regions 71 and the drain contact well 31, in order to insulate these regions from one another. Similarly, local regions of oxidation 50 are formed at the lateral ends of the surface of the well in order to insulate the transistor T1 from the rest of the integrated circuit CI of which it forms a part.

These regions 50 may be of the LOCOS type or else shallow trenches (STI: Shallow Trench Isolation).

FIG. 2 illustrates the result of initial steps of one example of a method for fabricating an integrated circuit CI. The integrated circuit CI here comprises five regions Z1, Z2, Z3, Z4, and Z5, bounded in the following figures by dashed lines, in which a JFET transistor T1, a bipolar transistor of the NPN type T2, an insulated-gate field-effect transistor of the PMOS type T3, a bipolar transistor of the PNP type T4 and an insulated-gate field-effect transistor of the NMOS type T5 will respectively be fabricated according to one embodiment of the invention.

Within a substrate 10 of silicon with P-type doping, highly-doped buried layers 11, 12, 13 of the N$^+$ type have been formed by shallow implantation in the respective regions Z1, Z2, Z3 of the substrate 10. Semiconductor wells 21, 22, 23 with N-type doping have been formed by epitaxy on top of these buried layers 11, 12, 13, respectively.

Similarly, highly-doped buried layers 14, 15 of the P$^+$ type have been formed by shallow implantation in the respective regions Z4, Z5, on which wells with n-type doping have been formed by epitaxy, then respectively converted into wells 24, 25 with P-type doping by ion implantation and diffusion of the dopants.

Highly-doped contact wells 31, 32 of the N$^+$ type have also been formed by implantation into the wells 21, 22. A highly-doped contact well 34 of the P$^+$ type has been formed by implantation into the well 24.

Each contact well 31, 32, 34 extends from the surface of the respective semiconductor well down to the respective buried layer.

In the following step, illustrated by FIG. 3, a layer of masking resist 40 is deposited on the surface of the wells 21 to 25 then etched according to a pattern pre-established by photolithography, exposing etch sites 40' on the surface of the wells 21 and 22.

Shallow trenches are etched into the wells 21 and 22 at the location of the etch sites 40'.

A highly-doped semiconductor material of the P$^+$ type is deposited into the trenches, forming field implantation regions 41, 42 in the respective wells 21, 22, and two gate regions 46 of the future JFET transistor in the well 21.

The future channel region ZC of the JFET transistor has thus been formed between the two gate regions 46, whose critical dimension of active surface D is controlled by photolithography.

Indeed, the lateral diffusion of the dopants in the well 21 is negligible compared with the dimension D and thus the dimension D is precisely determined by the corresponding part of the pattern transferred onto the resist.

Furthermore, the channel region ZC has been formed simultaneously with steps for fabrication of the NPN transistors of the integrated circuit.

FIG. 4 illustrates the result of steps not shown, amongst which a second masking has been implemented in order to form field implantation regions 44 within the well 24 with a highly-doped material of the N type.

Active regions of the integrated circuit CI have been bounded by local oxidations 50 on the surface of the wells 21 to 25, for example according to a known method of the LOCOS type (acronym coming from "LOCal Oxidation of Silicon").

Implantations of dopants have also been carried out, forming an intrinsic base region 52 and an extrinsic base region 62 respectively P-doped and highly-doped of the P$^+$ type within the well 22, and an intrinsic base region 54 and an extrinsic base region 64 respectively doped N and highly-doped of the N$^+$ type within the well 24.

The following step, shown in FIG. 5, is a photolithography step common to all the formations of the JFET, PMOS and PNP transistors.

A layer 70 of resist is deposited onto the surface of the wells 21 to 25 in which openings, also formed by photolithography according to a pre-established pattern, expose implantation sites 70' on the surfaces of the wells 21, 23 and 24.

A dopant of the P type is implanted at high density and to a shallow depth into these implantation sites 70', simultaneously forming an emitter 74 of the future PNP transistor, the gate contact regions 71 of the future JFET transistor, and the source and drain regions 73 of the future PMOS transistor, within the corresponding wells 24, 21 and 23.

The following step, shown in FIG. 6, is a photolithography step common to the formations of the JFET, NPN and NMOS transistors.

A layer 80 of resist is deposited on the surface of the wells 21 to 25 in which openings, also formed by photolithography according to a pre-established pattern, expose implantation sites 80' on the surface of the wells 21, 22 and 25.

A dopant of the N type is implanted at high density and to a shallow depth into these implantation sites 80', simultaneously forming an emitter 82 of the future transistor NPN, the source 81 of the future JFET transistor, and the source and drain regions 85 of the future NMOS transistor.

FIG. 7 shows an integrated circuit obtained according to one embodiment, comprising a vertical junction field-effect transistor T1, a bipolar transistor of the NPN type T2, a bipolar transistor of the PNP type T4, a PMOS transistor T3 and an NMOS transistor T5. The insulated gates of the PMOS transistor T3 and NMOS transistor T5 have been formed in a conventional manner and comprise an insulating layer 93, for example of silicon oxide, and a layer of gate material 95, for example polycrystalline silicon.

The following steps for contact formation, including for example steps for silicidation and for deposition of contacts, are carried out in a conventional manner and are not shown.

Figure 8:
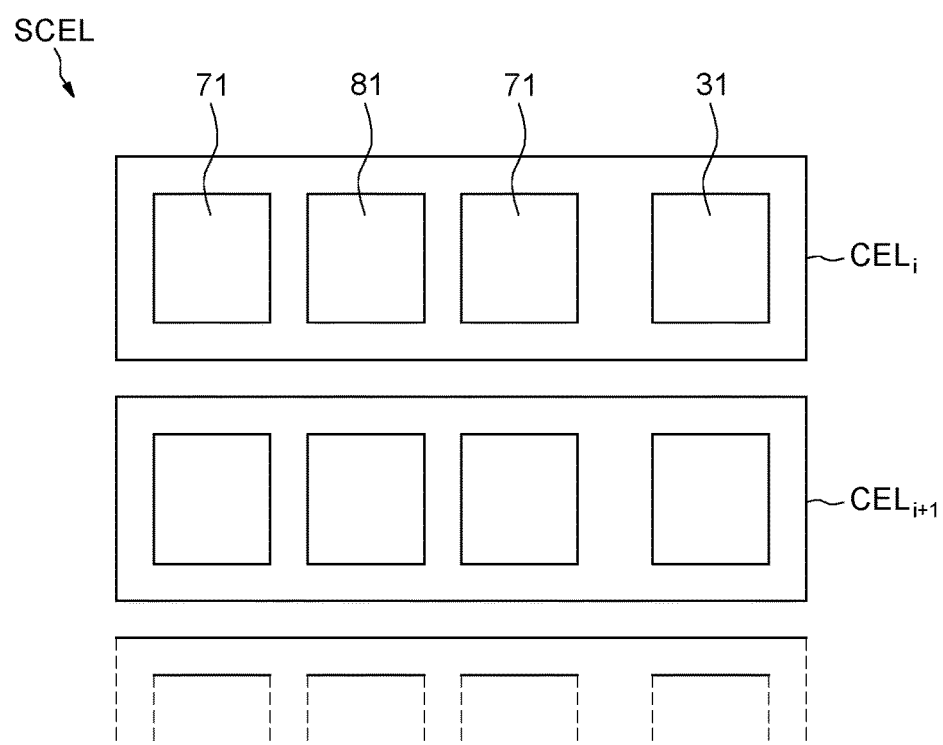

FIG. 8 shows schematically a cellular structure architecture for JFET transistors of the type of the transistor T1 shown in FIG. 1, in the plane P2, seen as "a top view".

The cellular structure SCEL comprises several unitary cells CEL$_i$, and each unitary cell CEL$_i$ comprises a JFET transistor notably comprising a drain region 31, two gate contact regions 71 and a source region 81.

The saturation drain current is known and controlled for each unitary cell. Thus, a saturation drain current may be adjusted to a desired value by connecting several unitary cells in parallel.

The saturation drain current of the cellular structure is then equal to the sum of the saturation drain currents of each unitary cell connected in parallel.

The cellular structure architecture of JFET transistors avoids having to fabricate the JFET transistors that are more extended in order to obtain a higher saturation drain current, extended JFET transistors exhibiting edge effects that are difficult to control and to model.

It is clear that the present invention is capable of several variants and modifications which will be apparent to those skilled in the art. In particular, the invention may be applied to the fabrication of a JFET transistor with a channel of the P type by reversing the corresponding types of conductivity.

The invention claimed is:

1. A method for fabricating an integrated circuit including a vertical junction field-effect transistor and a field effect transistor, comprising:
   forming, in a first semiconductor well of a first type of conductivity, two spaced apart gate regions of a second type of conductivity which define a channel region of the vertical junction field-effect transistor;
   forming, in the first semiconductor well, a field implantation region surrounding the channel region and two spaced apart gate regions;
   forming, in a second semiconductor well of the first type of conductivity, source and drain regions of the second type of conductivity for the field effect transistor;
   forming, in the first semiconductor well, contact regions of the second type of conductivity which electrically connect the two spaced apart gate regions of the vertical junction field-effect transistor to the field implantation region of the vertical junction field-effect transistor;
   wherein a same dopant implantation step is used to form the source and drain regions for the field effect transistor and the contact regions for the vertical junction field-effect transistor.

2. The method of claim 1, wherein forming the two spaced apart gate regions comprises:
   forming two spaced apart trenches in said first semiconductor well that bound said channel region; and
   filling the two spaced apart trenches with a semiconductor material of a second type of conductivity.

3. The method of claim 2, wherein forming the field implantation region comprises:
   forming a field trench in said first semiconductor well; and
   filling the field trench with said semiconductor material of the second conductivity type;
   wherein a same etching step is used to form the two spaced apart trenches and the field trench in the first semiconductor well; and
   wherein a same deposition step is used to fill the two spaced apart trenches and the field trench.

4. The method of claim 3, wherein the integrated circuit further includes a bipolar transistor, further comprising:
   forming a base region in a third semiconductor well for the bipolar transistor; and
   forming an emitter region in the base region;
   wherein said same dopant implantation step is used to form the source and drain regions for the field effect transistor, the contact regions for the vertical junction field-effect transistor and the emitter region of the bipolar transistor.

5. A method for fabricating an integrated circuit including a vertical junction field-effect transistor and a field effect transistor, comprising:
   forming, in a first semiconductor well of a first type of conductivity, two spaced apart gate regions of a second type of conductivity which define a channel region of the vertical junction field-effect transistor;
   forming, in a second semiconductor well of the first type of conductivity, source and drain regions of the second type of conductivity for the field effect transistor;
   forming insulating regions in the first semiconductor well over the two spaced apart gate regions and in the second semiconductor well delimiting a region which contains the source and drain regions;
   forming, in the first semiconductor well, contact regions of the second type of conductivity, each contact region positioned adjacent insulating regions in the first semiconductor well over the two spaced apart gate regions and extending under said insulating regions to make contact with the two spaced apart gate regions of the vertical junction field-effect transistor;
   wherein a same dopant implantation step is used to form the source and drain regions for the field effect transistor and the contact regions for the vertical junction field-effect transistor.

6. The method of claim 5, wherein forming the two spaced apart gate regions comprises:
   forming two spaced apart trenches in said first semiconductor well that bound said channel region; and
   filling the two spaced apart trenches with a semiconductor material of a second type of conductivity.

7. The method of claim 6, further comprising forming a field implantation region surrounding the channel region and two spaced apart gate regions, wherein forming the field implantation region comprises:
   forming a field trench in said first semiconductor well; and
   filling the field trench with said semiconductor material of the second conductivity type;
   wherein a same etching step is used to form the two spaced apart trenches and the field trench in the first semiconductor well; and
   wherein a same deposition step is used to fill the two spaced apart trenches and the field trench.

8. The method of claim 7, wherein forming said contact regions in the first semiconductor well comprises forming said contact regions to electrically connect the two spaced apart gate regions of the vertical junction field-effect transistor to the field implantation region of the vertical junction field-effect transistor.

9. The method of claim 7, wherein the integrated circuit further includes a bipolar transistor, further comprising:
   forming a base region in a third semiconductor well for the bipolar transistor; and
   forming an emitter region in the base region;
   wherein said same dopant implantation step is used to form the source and drain regions for the field effect transistor, the contact regions for the vertical junction field-effect transistor and the emitter region of the bipolar transistor.

* * * * *